(12) United States Patent  (10) Patent No.: US 9,171,110 B2
Deindl et al.  (45) Date of Patent: Oct. 27, 2015

(54) ACCELERATING FUNCTIONAL VERIFICATION OF AN INTEGRATED CIRCUIT

(75) Inventors: Michael Deindl, Tuebingen (DE); Jeffrey Joseph Ruedinger, Rochester, MN (US); Christian G. Zoellin, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 628 days.

(21) Appl. No.: 13/534,189

(22) Filed: Jun. 27, 2012

(65) Prior Publication Data

US 2014/0005992 A1  Jan. 2, 2014

(51) Int. Cl.
   *G06F 17/50* (2006.01)
   *G06G 7/62* (2006.01)
(52) U.S. Cl.
   CPC .................................. *G06F 17/5027* (2013.01)
(58) Field of Classification Search
   USPC ....................................................... 703/13, 14
   See application file for complete search history.

(56) References Cited

U.S. PATENT DOCUMENTS

| 5,426,784 | A * | 6/1995 | Kawata et al. ................ 713/600 |
| 6,055,656 | A | 4/2000 | Wilson et al. |
| 7,428,661 | B2 | 9/2008 | Michael |
| 7,550,995 | B1 | 6/2009 | Guilloteau et al. |
| 2011/0145665 | A1 | 6/2011 | Halstvedt et al. |

OTHER PUBLICATIONS

Xess, Hard row to hoe. Came up with squat, 1-10.

* cited by examiner

*Primary Examiner* — Saif Alhija
(74) *Attorney, Agent, or Firm* — Garg Law Firm, PLLC; Rakesh Garg; Parashos T. Kalaitzis

(57) ABSTRACT

Illustrative embodiments include a method, system, and computer program product for accelerating functional verification in simulation testing of an integrated circuit (IC). Using a processor and a memory, a serial operation is replaced with a direct register access operation, wherein the serial operation is configured to perform bit shifting operation using a register in a simulation of the IC. The serial operation is blocked from manipulating the register in the simulation of the IC. Using the register in the simulation of the IC, the direct register access operation is performed in place of the serial operation.

20 Claims, 5 Drawing Sheets

ACCELERATING FUNCTIONAL VERIFICATION OF AN INTEGRATED CIRCUIT

GOVERNMENT RIGHTS

This invention was made with government support under United States Department of Energy contract number B554331. THE GOVERNMENT HAS CERTAIN RIGHTS IN THIS INVENTION.

TECHNICAL FIELD

The present invention relates generally to a method, system, and computer program product for testing integrated circuits. Particularly, the present invention relates to a method, system, and computer program product for accelerating functional verification of an integrated circuit (IC).

BACKGROUND

Certain computer chip development programs, such as programs for developing processor ICs, use a combination of design methodologies. MPGZ is a semi-custom methodology used for this purpose. Application Specific Integrated Circuit (ASIC) is another methodology used in chip design, and is based on libraries of standard cells to be used in the IC design.

The functionality of the designed IC has to be tested or verified to ensure that the design performs as specified. This process of testing the functionality of the IC design is called functional verification. Typically, the functional verification process uses a simulation of the designed IC, and subjects the simulation to a battery of test cases. A test case includes instructions that cause the simulated IC to perform certain functions. For example, an instruction in a test case to write a test data pattern into a register of the simulated IC causes a write operation to be transmitted to the simulated IC, with the expected result that the test data pattern will be stored in the designated register.

SUMMARY

The illustrative embodiments provide a method, system, and computer program product for accelerating functional verification of an integrated circuit. In at least one embodiment, a method for accelerating functional verification in simulation testing of an integrated circuit (IC) is provided. The method includes replacing, using a processor and a memory, a serial operation with a direct register access operation, wherein the serial operation is configured to perform bit shifting operation using a register in a simulation of the IC. The method further includes blocking the serial operation from manipulating the register in the simulation of the IC. The method further includes performing, using the register in the simulation of the IC, the direct register access operation in place of the serial operation.

BRIEF DESCRIPTION OF THE SEVERAL VIEWS OF THE DRAWINGS

The novel features believed characteristic of the invention are set forth in the appended claims. The invention itself, however, including a preferred mode of use, further objectives and advantages thereof, will best be understood by reference to the following detailed description of illustrative embodiments when read in conjunction with the accompanying drawings, wherein:

DETAILED DESCRIPTION

Figure 1:
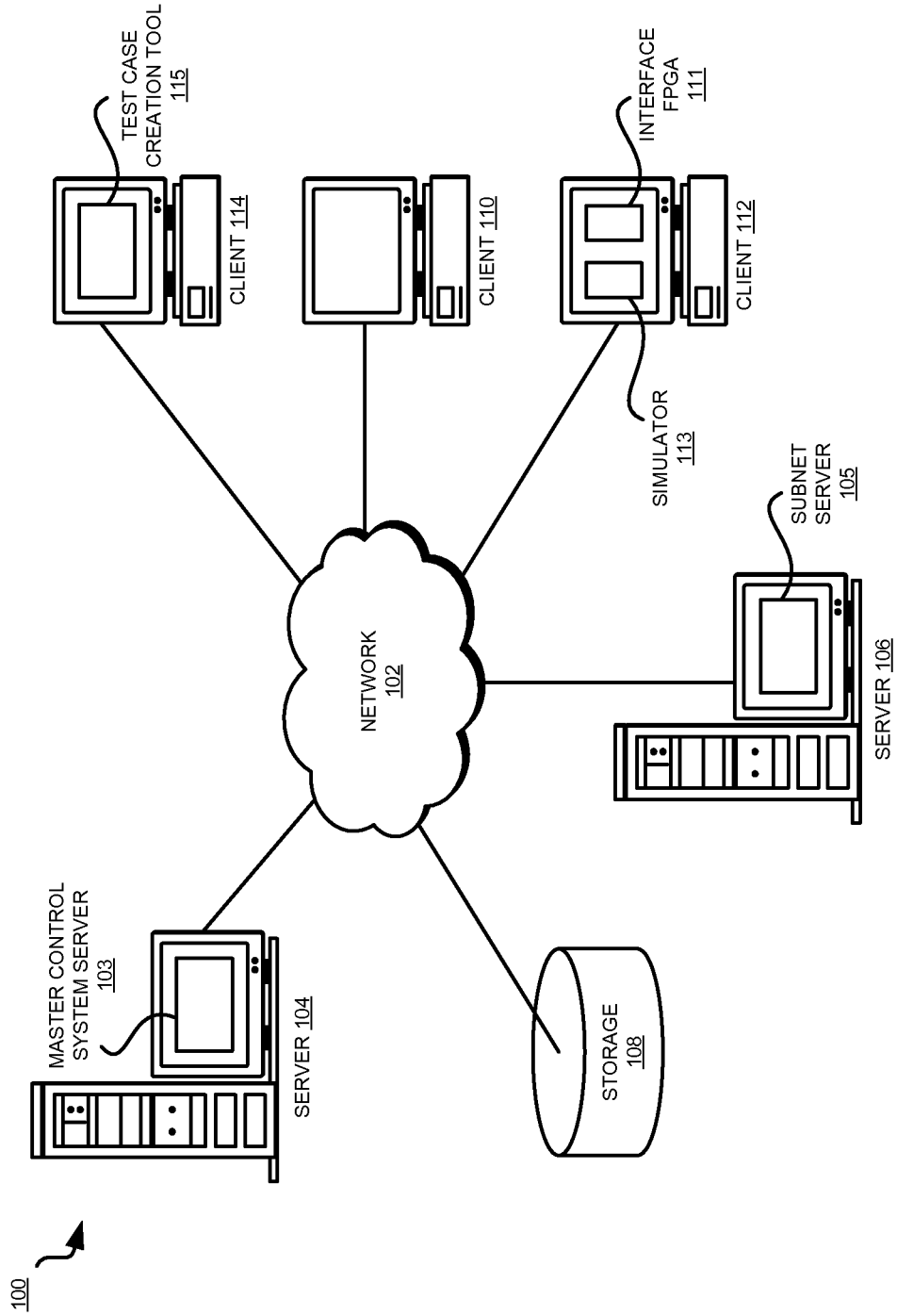
FIG. 1 depicts a pictorial representation of a network of data processing systems in which illustrative embodiments may be implemented.

The illustrative embodiments recognize that combining more than one design methodology, such as designing a processor IC using MPGZ and ASIC methodologies, creates significant challenges not encountered in a pure ASIC or pure MPGZ design. As a result, for example, several different protocols and layers of hierarchy are introduced between an external controller component of the IC and the internal registers in the IC. Consequently, the functional verification process has to traverse these layers, and convert between these protocols for external control and configuration of the simulated IC.

The illustrative embodiments recognize that these layer traversals and protocol conversions add a significant amount of complexity to the functional verification task. For example, a Power On Reset (POR) Sequence for functional verification of a design involving multiple design methodologies can include more than 250 steps, and can use multiple command types, whereas, in contrast, the same procedure is typically a "1 page" procedure for ICs designed using a pure ASIC or MPGZ methodology.

One method for functional verification uses Joint Test Action Group (JTAG) commands and data. JTAG commands shift data in and out of memory using serial operations. The illustrative embodiments recognize that shifting bit data serially, as JTAG functional verification methodology does, is a time consuming process. The illustrative embodiments recognize that as the complexity of the IC design and the length of the POR sequence have increased, simulation time using JTAG methodology has increased to unacceptable levels.

For example, in certain massively parallel architectures, an entire system, including approximately one hundred thousand processor ICs, has to be subjected to functional verification through simulation. The test case instructions are broken down to low-level JTAG operations and data and distributed to various IC simulations within the system simulation. Under such circumstances, an iteration of simulation testing can take several days, or even a week of computing time.

Typically, the design structures in the simulation and the eventual IC hardware that results from the design are identical. Therefore, a test case written for a simulation can also be used for testing the hardware in a similar manner.

Some prior art techniques that offer faster simulation testing require different test cases for testing the simulation and hardware. The illustrative embodiments recognize that requiring separate test cases for simulation testing and hardware testing creates extra test case generation work, poses a risk of generating test cases that may include unintended differences, creates additional possibilities for errors, and requires a significant amount of efforts to correlate the results of the simulation testing and the hardware testing.

Some other prior art techniques for accelerating the functional verification of an IC simulation allow using the same test cases for testing the simulation and the hardware. However, such techniques internally transform all test operations into different operations when applied to simulations. In other words, while the test case remains the same for simulation and hardware testing, all operations reaching the simulation are different from all operations reaching the hardware.

The illustrative embodiments recognize that such prior art acceleration methods also suffer from disadvantages. For example, such acceleration methodology is an all or nothing methodology. If one operation in the test case cannot be converted for any reason, the entire test case cannot be accelerated using such a methodology, and the methodology is ineffective in improving the simulation testing efficiency.

Some other prior art methodologies for accelerating function verification of a simulation accelerate the testing only in later iterations of multi-iteration testing. For example, such a methodology does not improve the runtime of the first iteration of the testing, but uses a result of a first iteration of testing to improve the efficiency of a second iteration. The illustrative embodiments recognize that for many simulations, if even a single iteration is cost prohibitive, the testing process may be unacceptable. Therefore, such acceleration methodologies are ineffective at achieving acceptable simulation times.

The illustrative embodiments used to describe the invention generally address and solve the above-described problems and other problems related to functional testing of IC designs through simulation. The illustrative embodiments provide a method, system, and computer program product for accelerating functional verification of an IC design simulation.

Furthermore, even if some prior art acceleration methodologies are marginally effective, the prior art acceleration methodologies are prone to failures because of the sheer size of the simulation models needed to represent modern IC architectures. The illustrative embodiments recognize that future generations of IC architectures are going to increase in size, requiring larger simulation models. Thus, the illustrative embodiments recognize that if the present tasting acceleration methodologies are marginal under the present circumstances, those methodologies are invariably going to be inadequate for future testing needs.

Generally, an embodiment of the invention intercepts certain serial shifting operations, such as the operations in JTAG testing methodology. For certain operations, the embodiment prevents the operation from being performed, and instead performs a direct read or write of the register that is the target of the operation. When a direct access to the target register is not possible, not feasible, not desirable, or a combination thereof, the embodiment allows the operation to proceed as intended before the interception.

Operating in this manner, an implementation of an embodiment is capable of reducing the execution time of a functional verification test by more than sixty percent, on a simulation testing of a large-scale multi-processing unit (core) design.

The illustrative embodiments are described with respect to certain designs, simulations, and instructions only as examples. Such descriptions are not intended to be limiting on the invention. For example, an illustrative embodiment described with respect to JTAG operation can be implemented with similarly purposed shifting operation of a different kind within the scope of the illustrative embodiments.

Furthermore, the illustrative embodiments may be implemented with respect to any type of data, data source, or access to a data source over a data network. Any type of data application or storage device may provide the data, such as data for deploying or configuring an application, to an embodiment of the invention, either locally at a data processing system or over a data network, within the scope of the invention.

An embodiment of the invention may be implemented with respect to any type of application, such as, for example, applications that are served, the instances of any type of server application, a platform application, a stand-alone application, an administration application, or a combination thereof. An application, including an application implementing all or part of an embodiment, may further include data objects, code objects, encapsulated instructions, application fragments, services, and other types of resources available in a data processing environment. For example, a Java object, an Enterprise Java Bean (EJB), a servlet, or an applet may be manifestations of an application with respect to which the invention may be implemented (Java and all Java-based trademarks and logos are trademarks or registered trademarks of Oracle and/or its affiliates).

An illustrative embodiment may be implemented in hardware, software, or a combination thereof. An illustrative embodiment may further be implemented with respect to any type of data storage resource, such as a physical or virtual data storage device, that may be available in a given data processing system configuration.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
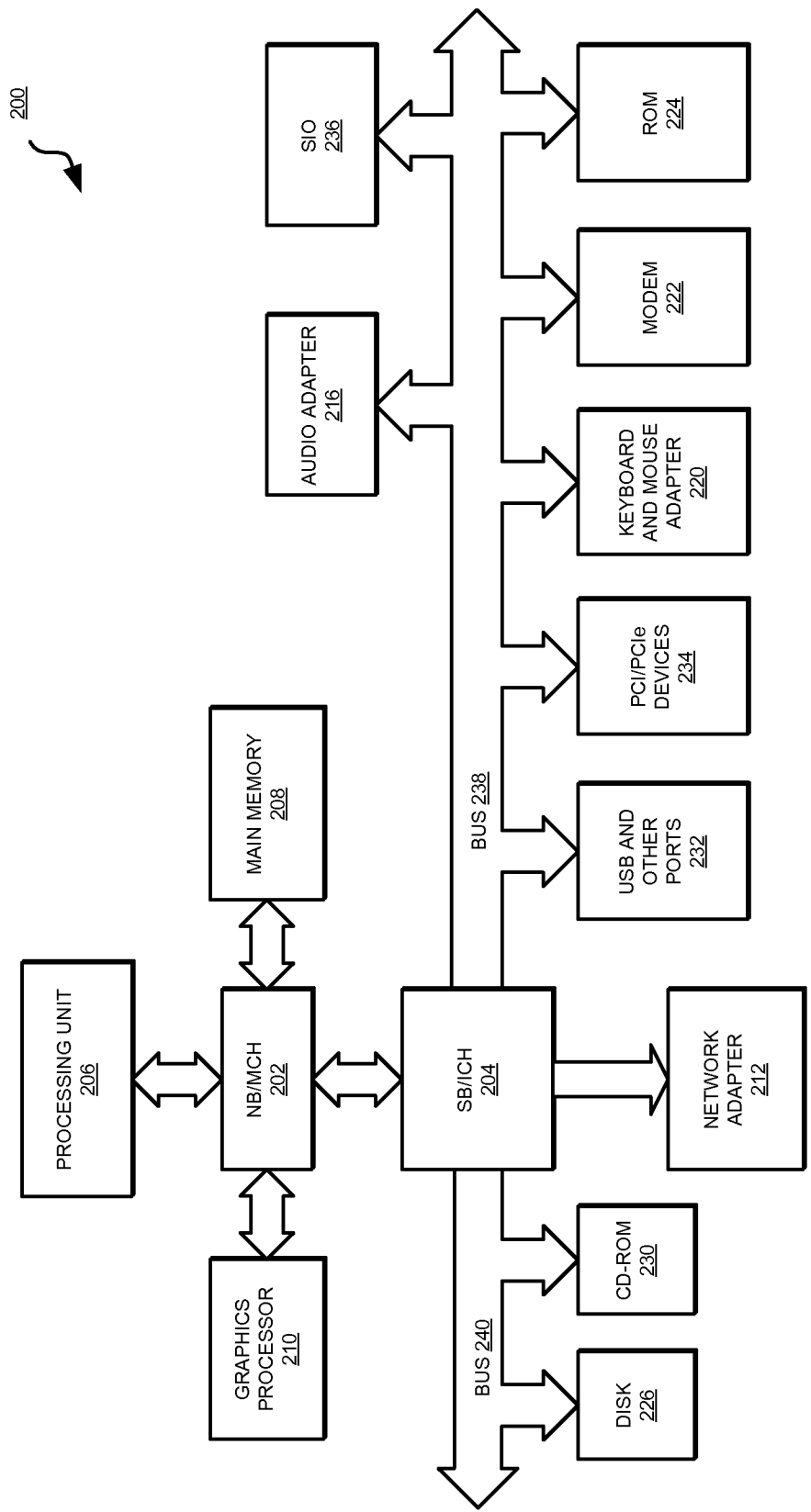
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Only as an example, and without implying any limitation to such architecture, FIG. 1 depicts certain components that are typically used for functional verification of IC simulations. For example, server 104 may include master control system server 103. Server 106 may include subnet server 105 and any number of subnet servers can execute in any number of data processing systems in a similar manner without limitation. Client 112 may include simulator 113 that may implement interface Field Programmable Gate Array (FPGA) 111. Client 114 may include test case creation tool 115. An example configuration of these and other components and operation thereof are depicted in subsequent figures.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client/server environment in which the illustrative embodiments may be implemented. A client/server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer or a data processing device, such as server 104, server 106, or client 114 in FIG. 1, in which computer usable program code or instructions implementing the processes for certain illustrative embodiments, such as, for example, the instructions for improved modeling tool 103 in FIG. 1, action semantics library 107 in FIG. 1, runtime engine 109 in FIG. 1, or sensor object 115 in FIG. 1, but not limited there to, may be located.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive 226, CD-ROM 230, and other similarly usable devices are some examples of computer usable storage devices including computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), or Linux® (Linux is a trademark of Linus Torvalds in the United States and other countries). An object oriented programming system, such as the Java programming system, may run in conjunction with the operating system and provides calls to the operating system from Java programs or applications executing on data processing system 200.

Instructions for the operating system, the object-oriented programming system, and applications or programs such as deployment file builder 113 in FIG. 1 and modified deployment engine 103 in FIG. 1 are located on at least one of one or more storage devices, such as hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
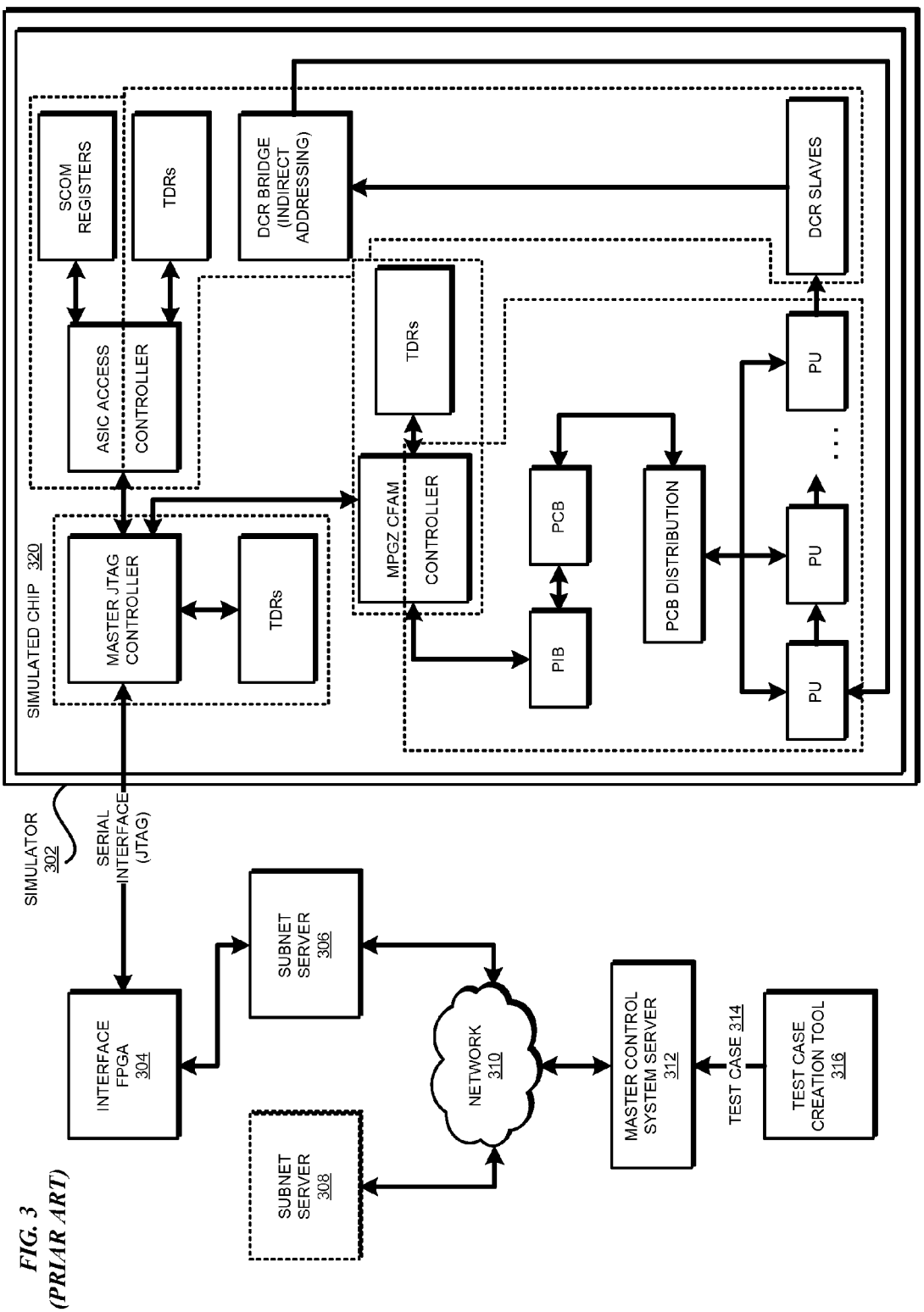
FIG. 3 depicts a block diagram of a presently used generalized configuration for functional verification of a simulated IC, whose simulation execution time can be improved using an illustrative embodiment.

With reference to FIG. 3, this figure depicts a block diagram of a presently used generalized configuration for functional verification of a simulated IC, whose simulation execution time can be improved using an illustrative embodiment. Simulator 302 is analogous to simulator 113 in FIG. 1. Interface FPGA 304 is similar to Interface FPGA 111 in FIG. 1. Subnet servers 306 and 308 are each similar to subnet server 105 in FIG. 1. Network 310 is analogous to network 102 in FIG. 1. Master control system server 312 is usable as master control system server 103 in FIG. 1.

Test case creation tool 316 is usable as test case creation tool 115 in FIG. 1. Test case creation tool 316 provides set of one or more test cases 314 to master control system server 312. The instructions of test case 314 are broken down into serial operations and data that interface FPGA 304 can communicate to the master JTAG controller in simulated chip 320 via a serial JTAG interface.

Simulated chip 320 corresponds to an architecture used in a massively parallel computing environment, such as in Blue Gene/Q project (Blue Gene and Blue Gene/Q are trademarks owned by International Business Machines Corporation, in the United States and in other countries.). Example simulated chip 320 illustrates the problem of numerous protocols and command types that are presently needed to perform functional verification on modern chip designs, as recognized by the illustrative embodiments.

Simulated chip 320 includes at least six different protocols and command types, namely, those used by—first, the master JTAG controller; second, the ASIC access controller to communicate with SCOM registers; third, the ASIC access controller to communicate with the Test Data Registers (TDR, plural TDRs); fourth, the MPGZ controller to communicate with the TDRs; fifth, the MPGZ controller to communicate with Pervasive Interconnect bus (PIB), which can be SCOM registers internally in the IC design; and sixth, the Device Control Register (DCR). In actual configuration of a similar nature, additional protocol types have to be considered in the simulated testing. For example, additional protocols exist within the Processing Unit (PU) but are not depicted in FIG. 3 for clarity.

For functional verification of each interface in simulated chip 320, test case 314 defines functions in a high level programming language, such as C++. To exercise different functions of simulated chip 320, these functions can vary by function name or by a function parameter, such as a target address of a register passed to the function.

For example, the POR Sequence code includes instances of functions, such as in the following example, to target the different interfaces of simulated chip 320: readTDR( ), writeTDR( ), readSCOM( ), writeSCOM( ), readDCR( ), and writeDCR( ), designed to exercise the read and write into TDRs, SCOM registers, and DCRs.

When testing a hardware implementation of the chip being simulated in simulated chip 320, master control system server 310, which controls the entire system, for example, approximately one hundred thousand Blue Gene/Q chips, executes these functions. Master control system server 312 breaks down these commands into lower level operations and data, and distributes via network 310 to any number of subnet servers 306 and 308. Each subnet server, such as subnet server 306, connects to a smaller set of hardware. Subnet servers 306 and 308 pass the low level operations and data to interface FPGA 304, which applies them serially into or out of the hardware via the master JTAG controller therein.

During simulation, simulated chip 320 maps the structure, architecture, components, and communications used by the hardware into the simulation environment of simulator 302. This direct mapping of hardware artifacts to simulated artifacts is desirable so that the code of test case 314 remains compatible with the hardware, allowing transparent execution if test cases on hardware or simulation models.

Using this structure on simulator 302, in a massively parallel computing environment, such as described above, the simulation execution time can range from several days to an entire week, depending on the level of detail being validated. For example, a multi-state validation will take longer simulation time as compared to a two state validation. The illustrative embodiments recognize that for an iteration of the simulation, this amount of time between debug iterations causes design delays, manufacturing delays, and other types of direct and indirect costs that are unacceptable. Therefore, the illustrative embodiments provide a new way of accelerating functional verification of an IC.

The illustrative embodiments recognize that verifying the types and ordering of commands can be done independently of verifying the serial shifting in and out of each command. By separating the two goals, an embodiment can significantly reduce the simulation execution time by removing the serial shifting operations. An embodiment accomplishes the removal of the serial shifting operations by substituting the shifting of each command with a direct model write ('put') or read ('get') to the internal register in simulated chip 320 being targeted by the operation. Such direct model writes and reads into and from internal registers are collectively referred to herein as direct register access, or direct access.

The illustrative embodiments further recognize that in addition to the shifting of JTAG command and data bits, some high-level functions like writeSCOM( ) have to add a number of idle-cycles to ensure that data is transported over internal buses before test case 314 proceeds to the next operation. An embodiment can remove such idle-cycles as well, when the embodiment substitutes the shifting with direct register access.

The illustrative embodiments further recognize that the presently used acceleration methodologies are limited by steps in test case 314 that must wait for simulated chip 320 to perform some task, such as, for example, wait for actions triggered by a previous register write to occur and complete. While a prior art acceleration methodology is limited to accelerating all or none of test case 314, an embodiment allows selectively accelerating some parts of test case 314 by replacing the serial shifting with direct register access, and allowing other parts of rest case 314 to reach simulated chip 320 in the presently used serial shifting manner.

Thus, an embodiment can accelerate test case 314 to some degree if at least some part of test case 314 can be substituted with direct register access of an embodiment. Operating in this manner, an embodiment allows full, non-accelerated regression performance of test case 314 on the chip hardware corresponding to simulated chip 320, but allows reducing the time spent initially in developing and testing the access procedures, thereby improving or containing the overall development costs. To enable the direct register access technique described above, an embodiment modifies the configuration of FIG. 3 in the manner of FIG. 4.

Figure 4:
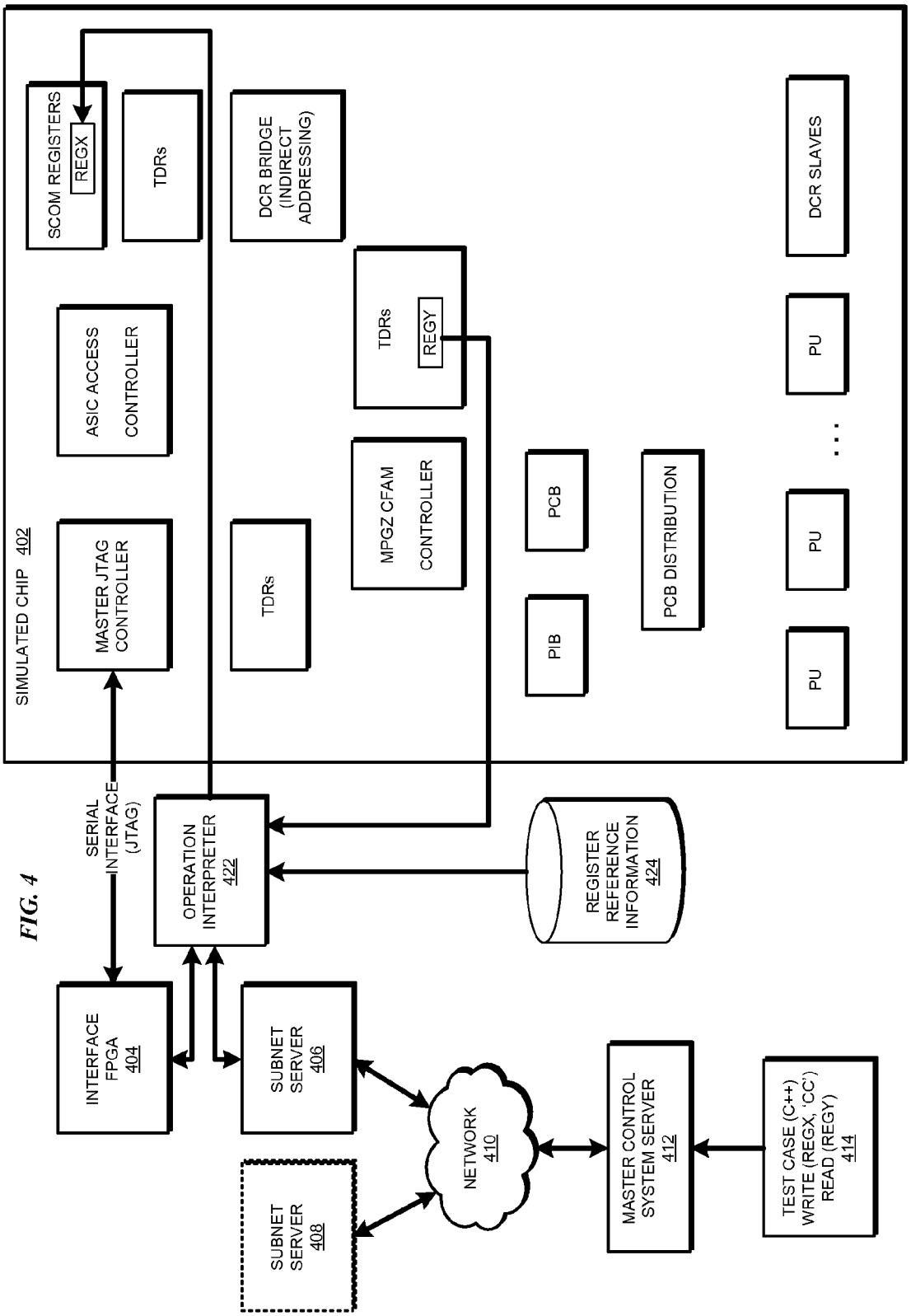
FIG. 4 depicts a block diagram of a modified generalized configuration for accelerated functional verification of a simulated IC in accordance with an illustrative embodiment.

With reference to FIG. 4, this figure depicts a block diagram of a modified generalized configuration for accelerated functional verification of a simulated IC in accordance with an illustrative embodiment. Simulated chip 402 corresponds to simulated chip 320 in FIG. 3, and similarly named components in simulated chip 402 and 320 are analogous to one another unless specifically described differently herein. Components 404, 406, 408, 410, 412, and 414 correspond to components 304, 306, 308, 310, 312, and 314 respectively in FIG. 3, and include specifically described differences there from, if described with respect to a component depicted in FIG. 4.

An embodiment add two new components to the simulation testing configuration, as depicted in FIG. 4, namely operation interpreter 422, and register reference information 424. Operation interpreter 422 reconstructs low level operations, such as JTAG bit shifting operation, into higher level commands that access internal registers in simulated chip 402 according to a direct register access method. Register reference information 424 maps access protocols and internal register addresses in an IC design to simulation model register names used for those registers in simulated chip 402 formed according to that IC design.

In the illustrative example depicted in FIG. 4, there are two operations to perform according to the example code of test case 414—Write the value 'CC' into register addressed in simulated chip 402 as 'regX' and Read the value of register addressed in simulated chip 402 as 'regY'.

Master control system server 412 executes these program functions of test case 414 by converting them to serial shift operations, then passes them to Interface FPGA 404 via a previously described process for execution. In this simple example, assuming a JTAG like structure that includes an Instruction Register (IR) and a Data Register (DR), the serial shift operations may appear as follows:
write:
Shift DR('CC')
Shift IR(write to 'address of regX')
read:
Shift IR(read from 'address of regY')
Shift DR( )

When no acceleration is applied, Interface FPGA 404 performs these shift operations by serially applying the data into and out of simulated chip 402, using the architected interfaces of simulated chip 402. Depending on the size of the IR and DR registers, and on a simulated ratio of shift clock to simulated chip 402's clock, these shift operations could take hundreds, thousands, or even more computing cycles to execute.

When acceleration according to an embodiment is applied however, operation interpreter 422 inspects the serial shift operations and re-constructs the high level function desired. Looking up the address of the targeted registers in register reference information 424, operation interpreter 422 finds that 'regX' can be written directly using a simulator 'put' command using the register identifier 'BGQ.req5489' (a direct register access). Similarly operation interpreter 422 finds using register reference information 424 that 'regY' can be read directly by using a simulator 'get' command with the register identifier 'BGQ.reg48787' (another direct register access).

Operation interpreter 422 replaces the shift instructions described above with the two direct register accesses. Using the first direct register access, operation interpreter 422 writes 'CC' at regX in simulated chip 402. Using the second direct register access, operation interpreter 422 reads the stored value from regY in simulated chip 402. After the two direct register accesses are performed, operation interpreter 422 returns the value of regY to the master control system server 412 as if the value were obtained using the serial shifting of the un-accelerated JTAG method.

From a test case perspective, the use of such example direct register access commands of an embodiment makes no apparent difference in the objectives or the results of test case 414. However because the two example direct register access commands occur measurably faster than advancing the simulation to actually perform the bit shifts, the embodiment achieves a tangible saving in the simulation execution time.

The example described above is a simple example to illustrate the general acceleration technique of an embodiment using direct register access. In reality, accesses are not that easy. For example, a read from a PU register has several bus crossings and protocol conversions. Therefore, in one embodiment, operation interpreter 422 further includes logic for decomposing more complex operations. An example of such a complex operation may result from an example 'readSCOM(PUregZ)' function call (not shown) in test case 414, which seeks to read register labeled regZ (not shown) in a PU, the register being a SCOM register.

Additionally, register reference information 424 can contain additional information other than just a mapping of simulation register name to a specific register address in the IC design. For example, a register containing a 'PLLs locked' indicator will not be valid until many cycles after the 'lock PLLs' action bit in a different register is written. Therefore, for example, in one embodiment, register reference information 424 includes information about a length of a wait period after a register action bit is written before that register, or a different register, can be read.

Internal protocol conversions are also accommodated in an embodiment of register reference information 424 and operation interpreter 422. For example, indirect access to busses, such as the DCR bus, implies a program instruction such as 'writeDCR(DCRregW, 1122)'. Such an example command in test case 414 may first have to write the value '1122' into a DCR_DATA register located on the ASIC access SCOM bus, and then may have to write the address of 'DCRregW' into the DCR_ADDRESS register, which is also located on the ASIC access SCOM bus. Only after both write operations have occurred, in that order, can a DCR bus operation to update the register be triggered. An embodiment of operation interpreter 422 and register reference information 424 includes data and logic to support such determinations before a shifting operation is replaced with a direct register access. For example, operation interpreter 422 of an embodiment in combination with register reference information 424 of an embodiment can determine the number of cycles to advance the simulator to actually write the data into the final destination register (the target register) in simulated chip 402.

To illustrate this complexity of operation interpreter 422 of an embodiment in combination with register reference information 424 of an embodiment, consider the following example of reading a PU register that is likely to be encountered in an actual simulation—

The code in test case 414 includes the following statement— value=readSCOM(address of PUregZ)

Serial shift operations performed by interface FPGA 404 in an un-accelerated environment would translate this statement as follows—

1) Shift IR(initiate read on PIB from 'PUregZ') in MPGZ CFAM controller
2) Execute a number of simulator cycles waiting for read command to propagate from 'PIB' to 'PCB' through 'PCB Distribution' to 'PU' and back
3) Shift IR(read PIB register called 'SCSCAN') in MPGZ CFAM controller
4) Shift out the contents of SCSCAN and return it to the Control System Server In an accelerated environment using an embodiment, operation interpreter 422 considers the first shift operation and recognizes the operation as an indirect command. Consequently, operation interpreter 422 considers the next operation and finds the operation to be an execution of simulator cycles. Upon making this finding, operation interpreter 422 performs a look-up the simulation register name 'PUregZ' from register reference information 424 and performs direct simulator 'get' of that register (a direct register access). Operation interpreter 422 then performs a direct simulator 'put' of the read data into the 'SCSCAN' register (another direct register access), having looked up a simulation register name for 'SCSCAN' register from register reference information 424 as well. Thereafter, operation interpreter 422 considers these two shift operations complete, having executed a direct register access equivalent of the first shift operation and having achieved the effect of the second shift operation in another direct register access operation.

Proceeding to the next shift operation, operation interpreter 422 finds that the shift operation is a read of the 'SCSCAN' register. After receiving the simulated register name corresponding to 'SCSCAN' register from register reference information 424, operation interpreter 422 performs another direct simulator 'get' (another direct register access) and returns the data to the master control system server 412 and considers the third and fourth shift operations as completed.

This example illustrates that operation interpreter 422 and register reference information 424 of an embodiment can be as complex as needed according to the test case being used and the simulation being executed. For example, register reference information 424 can include tiered knowledge and information of the hardware, thus allowing more complex operations replacements than simple one-to-one substitution of register read operations and register write operations.

Register reference information 424 can be more complex than a look-up table. For example, register reference information 424 of an embodiment receives information from databases holding IC design specifications or notations. In one embodiment, register reference information 424 identifies registers by roles rather than by using a register name mapping table. A database gathers references inserted into the source design (using VHDL or Verilog) by the logic designer to create a database from which register documentation can be produced.

In an embodiment where register reference information 424 is implemented in a database with application programming interface (API) capabilities, register reference information 424 leverages the database's information input by the design team, so that register reference information 424 can also provide information about protocol types, register to register interactions, and wait delays. Advantageously, such embodiment of register reference information 424 can also be rebuilt at any tire from the design source, thereby automatically keeping pace with design changes and removing the need for expensive and error prone manual maintenance.

Note that an embodiment does not require interpretation and replacement of low level operations in every operation. For example, if operation interpreter 422 cannot reconstruct the higher level command for some reason, or register reference information 424 cannot provide a cross reference information for a particular register in simulated chip 402, the serial shifting can continue to be applied from interface FPGA 404 via the serial JTAG interface without any acceleration benefit from the direct register access according to an embodiment.

This selective acceleration of some serial shifting operations and not of other serial shifting operations is useful because an embodiment allows adding or removing of acceleration incrementally, allowing for evolutionary development of the simulation environment. Operating in this selective acceleration manner, an embodiment also allows for focused and custom tailored debugging process. For example, a problem may occur at step N of a specific long functional verification simulation testing. An embodiment can accelerate the testing of steps 1 through (N−1) to reach problem quickly, and then reduce or remove the acceleration at step N, and further for steps (N+1) et seq. if needed, so the problem can be isolated using the real hardware access methods according to JTAG or other similarly purposed method.

The selective acceleration of an embodiment also allows enabling or disabling the acceleration at runtime, without requiring a change to the simulation environment, test case, or simulated chip 402. This enabling or disabling the acceleration at runtime ensures there are no differences between the accelerated and un-accelerated simulations except in the way the low level operations are applied, thereby removing a potential source of discontinuity and error between the two modes of verification.

Figure 5:
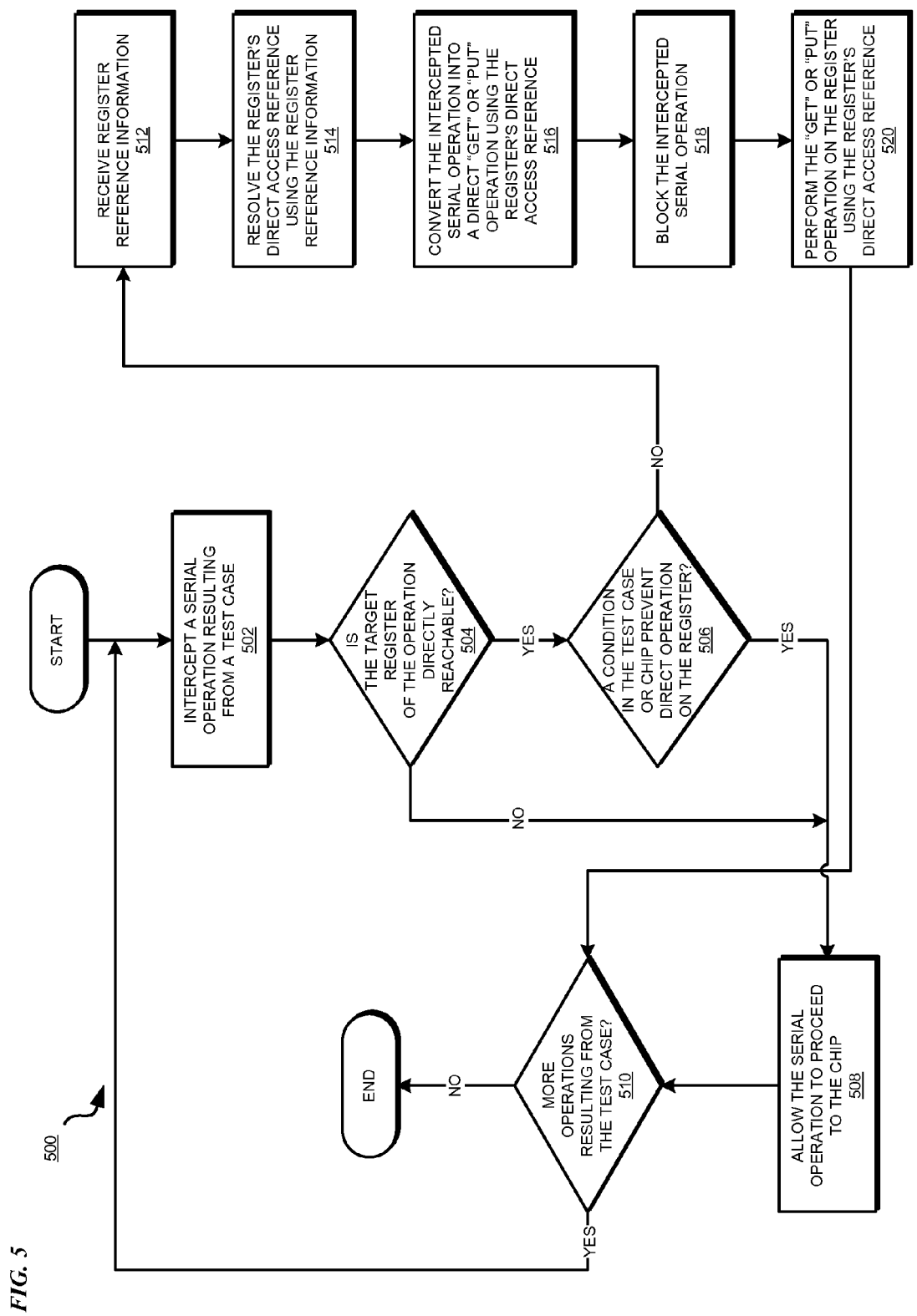
FIG. 5 depicts a flowchart of an example process of accelerating functional verification of an IC in accordance with an illustrative embodiment.

With reference to FIG. 5, this figure depicts a flowchart of an example process of accelerating functional verification of an IC in accordance with an illustrative embodiment. Process 500 can be implemented using operation interpreter 422 in FIG. 4.

Process 500 begins by intercepting a serial operation resulting from a command in a test case and destined for a register in a simulated chip (the target register) (step 502). Process 500 determines whether the register that is the target of the serial operation directly identifiable, reachable, or otherwise accessible for a direct register access operation (step 504).

If the register is identifiable, reachable, or otherwise accessible ("Yes" path of step 504), process 500 further determines whether a condition in the test case or the simulated chip prevents a direct operation on the register (a direct register access) or makes the direct register access undesirable (step 506). If a direct register access to the register is prevented or undesirable ("Yes" path of step 506), process 500 allows the serial operation to proceed to the simulated chip un-accelerated (step 508).

Process 500 determines whether more operations resulting from the test case are to be analyzed for replacement with direct register access in this manner (step 510). If more operations exist ("Yes" path of step 510), process 500 returns to step 502. If no more operations are to be analyzed for replacement ("No" path of step 510), process 500 ends thereafter.

Returning to step 504, if the register is not identifiable, reachable, or otherwise accessible for direct register access ("No" path of step 504), process 500 proceeds to step 508 and continues there from. Process 500 may return to step 502 or end thereafter.

Returning to step 506, if a direct register access to the register is not prevented or not undesirable ("No" path of step 506), process 500 receives register reference information corresponding to the target register, such as from register reference information 424 in FIG. 4 (step 512).

Process 500 resolves the target register's direct register access reference using the received register reference information (step 514). Process 500 converts the intercepted serial operation into a direct register access operation, such as a direct "get" or "put" operation at the target register (step 516).

Process 500 blocks the intercepted serial operation from proceeding to the simulated chip (step 518). In one embodiment, the blocking of step 518 results in removal of the intercepted command from the bit stream. Blocking or removing the intercepted command does not imply that subsequent commands are also blocked or removed. As described elsewhere, some commands may be blocked or removed in this manner while other preceding or subsequent commands may proceed to the simulated chip.

Process 500 performs the direct register operation on the target register using the register reference information corresponding to the target register (step 520). Process 500 proceeds to step 510 thereafter. Process 500 may return to step 502 or end thereafter.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide a method, system, and computer program product for accelerating functional verification of an integrated circuit simulation. An embodiment leverages the notion that verification of the order and types of commands can be separated from the act of serially shifting commands, allowing one to proceed and be accelerated without the other. An embodiment leverages this separation to intelligently and selectively accelerate a wide range of functional verification test cases as compared to prior art where simplified substitution is applied to inserting or reading scan patterns as part of manufacturing test verification or generation.

An embodiment can replace, all, part or none of the serial shifts. Furthermore, an embodiment can not only replace simple register access, but can also replace complex access-protocols over several buses. An embodiment can be extended to multiple interfaces and protocols, for example, JTAG, DCR, PIB/PCB, SCOM, and many others. An embodiment includes logic for handling direct and indirect accesses, register to register dependencies, and time delays between accesses.

An operation interpreter of an embodiment can reconstruct one or more serial operations according to the serial operations' higher level intent. An embodiment can also associate target registers with special acceleration characteristics, such as minimum wait time after a write or dependencies on other registers. An embodiment can utilize a database intended for documentation of IC design, for a different function, namely to look up simulated register references, characteristics, and dependencies for architectural registers. Generally, an embodiment can receive register references from any source or combination of sources, for example, from a repository and special design overwrites.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device. The terms "computer usable storage device," "computer readable storage device," and "storage device" do not encompass a transitory medium, any description in this disclosure to the contrary notwithstanding.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a wide area network (WAN), or a mobile ad hoc network (MANET), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart-illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or mere computers, one or more other programmable data processing apparatuses, or one or more other devices to cause a series of operational blocks to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, a set includes one or more members unless the context indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for accelerating functional verification in simulation testing of an integrated circuit (IC), the method comprising:
    replacing, using a processor and a memory, a serial operation with a direct register access operation, wherein the serial operation is configured to perform bit shifting operation using a register in a simulation of the IC;
    blocking the serial operation from manipulating the register in the simulation of the IC; and
    performing, using the register in the simulation of the IC, the direct register access operation in place of the serial operation.

2. The method of claim 1, further comprising:
    receiving, from a register reference information repository, a register reference information;
    resolving, using the register reference information, a first identifier used in the serial operation to reference the register in the simulation of the IC to a second identifier used to reference the register in the simulation of the IC; and
    using the second identifier in the direct register access operation to manipulate the register in the simulation of the IC.

3. The method of claim 2, further comprising:
    receiving, from the register reference information repository, information describing a dependency of the register on a second register in the simulation of the IC, wherein the performing the direct register operation on the register in the simulation of the IC occurs after the dependency is satisfied.

4. The method of claim 2, further comprising:
    receiving, from the register reference information repository, information describing a wait time before the register in the simulation of the IC can be manipulated, wherein the performing the direct register operation on the register in the simulation of the IC occurs after the wait time has elapsed.

5. The method of claim 1, further comprising:
    intercepting the serial operation before the serial operation manipulates the register in the simulation of the IC.

6. The method of claim 1, further comprising:
    determining whether the register in the simulation of the IC is accessible for the direct register access operation, and wherein the replacing is responsive to the register being accessible for the direct register access operation.

7. The method of claim 1, wherein the replacing is responsive to determining that the test case does not include a condition that makes the direct register access operation undesirable.

8. The method of claim 1, wherein the replacing is responsive to determining that the direct register access operation is not made undesirable by a condition in the simulation of the IC.

9. The method of claim 1, wherein the serial operation results from decomposing a command in a test case, and wherein the command in the test case is configured to verify a function of the simulation of the IC.

10. The method of claim 1, wherein the direct register access operation is configured to manipulate the register in the simulation of the IC.

11. The method of claim 10, wherein manipulating the register in the simulation of the IC according to the direct register access operation achieves a result desired from the serial operation, and wherein direct register operation achieves the result in a first simulation time such that the first simulation time is shorter than a second simulation time needed to achieve the result using the serial operation.

12. The method of claim 1, further comprising:
allowing a second serial operation to pass to the simulation of the IC; and
allowing the second serial operation to manipulate a second register in the simulation of the IC, wherein the serial operation and the second serial operation both result from commands in the test case.

13. The method of claim 1, wherein the direct register access operation is a "get" operation performed on the register in the simulation of the IC.

14. The method of claim 1, wherein the direct register access operation is a "put" operation performed on the register in the simulation of the IC.

15. A computer usable program product comprising a computer usable storage device including computer usable code for accelerating functional verification in simulation testing of an integrated circuit (IC), the computer usable code comprising:
computer usable code for replacing, using a processor and a memory, a serial operation with a direct register access operation, wherein the serial operation is configured to perform bit shifting operation using a register in a simulation of the IC;
computer usable code for blocking the serial operation from manipulating the register in the simulation of the IC; and
computer usable code for performing, using the register in the simulation of the IC, the direct register access operation in place of the serial operation.

16. The computer usable program product of claim 15, further comprising:
computer usable code for receiving, from a register reference information repository, a register reference information;
computer usable code for resolving, using the register reference information, a first identifier used in the serial operation to reference the register in the simulation of the IC to a second identifier used to reference the register in the simulation of the IC; and
computer usable code for using the second identifier in the direct register access operation to manipulate the register in the simulation of the IC.

17. The computer usable program product of claim 16, further comprising:
computer usable code for receiving, from the register reference information repository, information describing a dependency of the register on a second register in the simulation of the IC, wherein the performing the direct register operation on the register in the simulation of the IC occurs after the dependency is satisfied.

18. The computer usable program product of claim 15, wherein the computer usable code is stored in a computer readable storage device in a data processing system, and wherein the computer usable code is transferred over a network from a remote data processing system.

19. The computer usable program product of claim 15, wherein the computer usable code is stored in a computer readable storage device in a server data processing system, and wherein the computer usable code is downloaded over a network to a remote data processing system for use in a computer readable storage device associated with the remote data processing system.

20. A data processing system for accelerating functional verification in simulation testing of an integrated circuit (IC), the data processing system comprising:
a storage device including a storage medium, wherein the storage device stores computer usable program code; and
a processor, wherein the processor executes the computer usable program code, and wherein the computer usable program code comprises:
computer usable code for replacing, using a processor and a memory, a serial operation with a direct register access operation, wherein the serial operation is configured to perform bit shifting operation using a register in a simulation of the IC;
computer usable code for blocking the serial operation from manipulating the register in the simulation of the IC; and
computer usable code for performing, using the register in the simulation of the IC, the direct register access operation in place of the serial operation.

* * * * *